United States Patent

Kobayashi

[11] Patent Number: 6,008,883
[45] Date of Patent: Dec. 28, 1999

[54] APPARATUS AND METHOD FOR EXPOSURE

[75] Inventor: Naoyuki Kobayashi, Kanagawa-ken, Japan

[73] Assignee: Nikon Corporation, Tokyo, Japan

[21] Appl. No.: 09/010,500

[22] Filed: Jan. 21, 1998

[30] Foreign Application Priority Data

Jan. 23, 1997 [JP] Japan .................................. 9-024332

[51] Int. Cl.⁶ .................................................. G03B 27/42
[52] U.S. Cl. ............................... 355/53; 355/72; 355/75; 378/34; 250/492.1; 250/492.2; 250/548; 356/400
[58] Field of Search .................................. 355/53, 67, 72, 355/75; 250/492.1, 492.2, 548; 414/935, 936; 378/34; 356/399–401

[56] References Cited

U.S. PATENT DOCUMENTS

| | | |
|---|---|---|
| 4,226,569 | 10/1980 | Gerard et al. . |
| 4,786,947 | 11/1988 | Kosugi et al. . |
| 5,150,153 | 9/1992 | Franken et al. ............................ 355/53 |
| 5,187,519 | 2/1993 | Takabayashi et al. . |
| 5,204,712 | 4/1993 | Bouwer et al. ............................ 355/53 |

FOREIGN PATENT DOCUMENTS

| | | |
|---|---|---|
| 0811883 | 12/1997 | European Pat. Off. . |
| 148911 | 6/1981 | Germany ................................. 355/53 |
| 2299867 | 10/1996 | United Kingdom . |
| WO 96/38764 | 12/1996 | WIPO . |
| WO 96/38765 | 12/1996 | WIPO . |
| WO 96/38766 | 12/1996 | WIPO . |
| WO 96/38767 | 12/1996 | WIPO . |
| WO 9638764 | 12/1996 | WIPO . |

*Primary Examiner*—D. Rutledge
*Attorney, Agent, or Firm*—Armstrong, Westerman, Hattori, McLeland & Naughton

[57] ABSTRACT

Disclosed is an exposure apparatus for transferring a pattern formed on a mask to a substrate. The apparatus comprises: a support mechanism having three support legs, the three support legs being adapted to support the support mechanism at three points relative to an installation surface for the exposure apparatus. An illumination optical system is provided on the support mechanism to illuminate the mask having the pattern formed thereon. In the apparatus, as viewed in a vertical direction relative to the installation surface, the three support legs constitute three vertexes of a triangle and the illumination optical system is substantially symmetrical with respect to a straight line drawn from one vertex of the triangle toward the middle point in one side of the triangle opposite the one vertex.

53 Claims, 4 Drawing Sheets

APPARATUS AND METHOD FOR EXPOSURE

BACKGROUND OF THE INVENTION

The present invention relates to an exposure apparatus for use in producing semiconductor devices and liquid crystal displays.

In a photolithography process in the manufacture of semiconductor devices and liquid crystal displays, a projection exposure apparatus is used for forming a fine circuit pattern on a semiconductor layer or a metallic wiring layer. In the projection exposure apparatus, a reticle or a photomask (hereinafter, frequently referred to simply as "reticle") having formed thereon a circuit pattern is provided on a reticle stage, and a wafer stage having provided thereon a semiconductor wafer or a glass substrate (hereinafter, frequently referred to simply as "wafer") with a photoresist coating is moved relative to the reticle along an x-axis and a y-axis in a two-dimensional plane, to thereby transfer the circuit pattern formed on the reticle to a predetermined area on the wafer.

Types of exposure apparatuses can be roughly classified as a projection exposure apparatus of a step and repeat type in which a pattern on a reticle is projected through a projection optical system as a reduced pattern image and the reduced pattern image is formed on each exposure field on a wafer, and a scanning projection exposure apparatus of a so-called step and scan type in which a part of a pattern on a reticle is projected through a projection optical system on a wafer while moving the reticle and the wafer synchronously in predetermined scanning directions, to thereby transfer the pattern on the reticle to the wafer.

In conventional exposure apparatuses, such as mentioned above, main components of the exposure apparatus, i.e., an illumination optical system, a mask stage and a substrate stage, are supported relative to an installation surface for the exposure apparatus by four support legs. It is preferred that these components be maintained precisely horizontally. However, it is extremely difficult to maintain these components of the exposure apparatus on a horizontal plane by adjusting the lengths of four support legs, so that dynamic stability of the entire exposure apparatus is likely to be poor. Further, the area of the installation surface for the exposure apparatus, which is included within four support legs, is relatively large.

BRIEF SUMMARY OF THE INVENTION

In view of the above, the present invention has been made. It is an object of the present invention to provide an exposure apparatus which has an excellent dynamic stability for exposure.

It is another object of the present invention to provide an exposure apparatus which can be easily adjusted for installation when flatness of an installation surface for the exposure apparatus is poor.

It is still another object of the present invention to provide an exposure apparatus in which a floor space for installing the exposure apparatus per unit is small.

It is a further object of the present invention to provide a method suitable for supporting an illumination optical system used in the above-mentioned exposure apparatus.

It is a still further object of the present invention to provide an exposure method which is excellent in dynamic stability when applied to a scanning type exposure method.

According to one embodiment of the present invention, there is provided an exposure apparatus for transferring a pattern of a mask to a substrate, comprising:

a support mechanism having three support legs, the three support legs being adapted to support the support mechanism at three points relative to an installation surface for the exposure apparatus; and an illumination optical system provided on the support mechanism to illuminate the mask having the pattern, wherein as viewed in a vertical direction relative to the installation surface, the three support legs constitute three vertexes of a triangle and the illumination optical system is substantially symmetrical with respect to a straight line drawn from one vertex of the triangle toward the middle point in one side of the triangle, the one side of the triangle being opposite the one vertex.

According to another embodiment of the present invention, there is provided an exposure apparatus comprising:

a mask stage adapted to move while holding a mask thereon, the mask having a pattern;

a substrate stage adapted to move while holding a substrate thereon, the substrate being adapted to have formed thereon an image of the pattern;

a scanning device adapted to move the mask stage and the substrate stage synchronously in predetermined scanning directions; and a support mechanism having three support legs, the three support legs being adapted to support the mask stage and the substrate stage at three points relative to an installation surface for the exposure apparatus, wherein as viewed in a vertical direction relative to the installation surface, the three support legs constitute three vertexes of a triangle and the scanning directions of the mask stage and the substrate stage are substantially parallel to a straight line drawn from one vertex of the triangle toward the middle point in one side of the triangle, the one side of the triangle being opposite the one vertex.

According to still another embodiment of the present invention, there is provided an exposure apparatus for transferring a pattern of a mask to a substrate, comprising:

a substrate stage adapted to move, while holding the substrate thereon, in a two-dimensional plane in one predetermined direction and a direction perpendicular to the one predetermined direction; and a support mechanism having three support legs, the three support legs being adapted to support the substrate stage at three points relative to an installation surface for the exposure apparatus, wherein as viewed in a vertical direction relative to the installation surface, the three support legs constitute three vertexes of a triangle and the one predetermined direction is substantially parallel to a straight line drawn from one vertex of the triangle toward the middle point in one side of the triangle, the one side of the triangle being opposite the one vertex.

According to a further embodiment of the present invention, there is provided a method for supporting an illumination optical system used in an exposure apparatus relative to an installation surface for the exposure apparatus, the illumination optical system having a central axis, comprising:

supporting a support mechanism at three points by three support legs, the support mechanism being adapted to support the illumination optical system and the three support legs being supported on the installation surface; and disposing the illumination optical system at a position such that as viewed in a vertical direction relative to the installation surface, the central axis of the illumination optical system is substantially coincident with a straight line drawn from one vertex of a triangle determined by the three support legs toward the middle point in one side of the triangle, the one side of the triangle being opposite the one vertex.

According to a still further embodiment of the present invention, there is provided an exposure method comprising:

providing a mask stage adapted to move while holding a mask thereon, the mask having a pattern;

providing a substrate stage adapted to move while holding a substrate thereon, the substrate being adapted to have formed thereon an image of the pattern; and moving the mask stage and the substrate stage synchronously in predetermined scanning directions, to thereby transfer the pattern on the mask to the substrate, wherein a support mechanism adapted to support the mask stage and the substrate stage is supported at three points by three support legs, the three support legs being supported on an installation surface for the exposure apparatus and the mask stage and the substrate stage are disposed in a manner such that as viewed in a vertical direction relative to the installation surface, the scanning directions of the mask stage and the substrate stage are substantially parallel to a straight line drawn from one vertex of a triangle determined by the three support legs toward the middle point in one side of the triangle, the one side of the triangle being opposite the one vertex.

In the conventional exposure apparatus which is supported as a whole at four points, cumbersome operations for adjusting the length of each support leg must be conducted when the exposure apparatus is installed. The exposure apparatus of the present invention is supported as a whole at three points, so that the exposure apparatus can be easily adjusted to a datum plane.

When the exposure apparatus is supported as a whole at three points by a mechanism, such as a kinematic mount, so as to improve stability of the exposure apparatus, it is preferred that the illumination optical system (ILS) which has a large weight be supported at a plurality of support points, from the viewpoint of a balance of the entire exposure apparatus.

Especially, with respect to the projection exposure apparatus of a step and scan type, it is desired that the exposure apparatus have an excellent dynamic stability, so that it is preferred that the exposure apparatus be symmetrical with respect to the scanning directions of the mask stage and the substrate stage. When the conventional exposure apparatus is changed simply by utilizing three support legs, instead of four support legs, in order to ensure that the exposure apparatus is symmetrical with respect to the scanning directions of the mask stage and the substrate stage, problems occur as mentioned below.

When one of the three support legs is disposed at the front of the exposure apparatus facing a passage for a conveying robot or the like, while the remaining two support legs are disposed so that a side determined by these two support legs is parallel to the passage, and a wafer loader is disposed on the side of the front of the exposure apparatus, due to the one support leg at the front of the exposure apparatus, a wafer cannot be conveyed in a direct course from the wafer loader on the side of the front of the exposure apparatus to the wafer stage. That is, when a wafer loader and a reticle loader are disposed on the side of the front of the exposure apparatus, although wafers and reticles can be conveyed in a short period of time from the conveying robot which has passed through the passage on the side of the front of the exposure apparatus to the wafer loader and the reticle loader, the support leg at the front of the exposure apparatus disturbs conveyance of wafers from the wafer loader to the wafer stage and conveyance of reticles from the reticle loader to the reticle stage. Therefore, it is impossible to minimize a distance for conveying wafers and reticles from the conveying robot to the wafer stage and the reticle stage. This leads to problems, such that the time period required for exchanging wafers between the wafer loader and the wafer stage is prolonged and that the size of the exposure apparatus becomes unnecessarily large due to a space of no use within the exposure apparatus, so that the size of a chamber accommodating the exposure apparatus also becomes unnecessarily large. In the present invention, these problems are solved by disposing the wafer loader adjacent to a lateral side of the exposure apparatus.

DETAILED DESCRIPTION OF THE INVENTION

Before explaining embodiments of the present invention, for easy understanding of the present invention, description is given below of a general construction of a conventional projection exposure apparatus, especially a scanning projection exposure apparatus of a so-called step and scan type, with reference to FIGS. 5 and 6.

Figure 5:
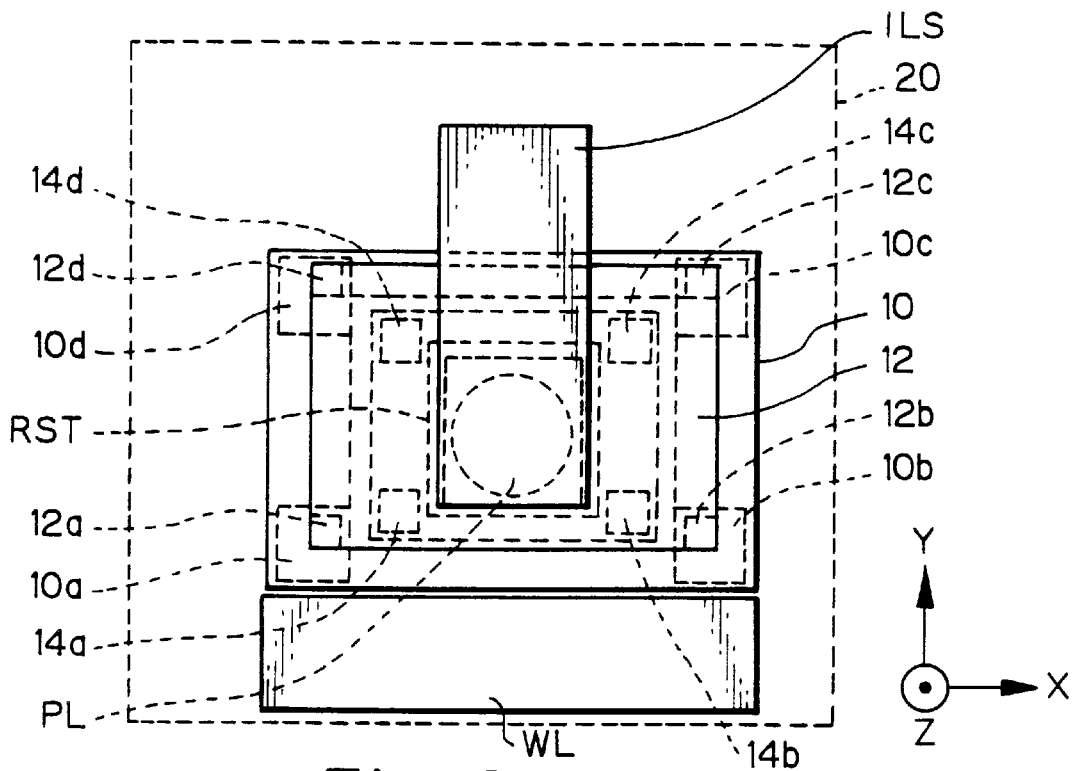
FIG. 5 is a top view of a conventional exposure apparatus.

FIG. 5 shows a conventional projection exposure apparatus viewed from above toward an installation surface therefor. FIG. 6 shows a conventional projection exposure apparatus viewed from a front thereof. The "front of the projection exposure apparatus" herein means a side of the projection exposure apparatus facing a passage for a conveying robot or the like for conveying a plurality of wafers to a substrate-conveying apparatus (hereinafter, referred to simply as "wafer loader"), which is adjacent to the projection exposure apparatus in a clean room. The conveying robot passes through the passage to the wafer loader and supplies the wafers to the wafer loader.

Figure 6:
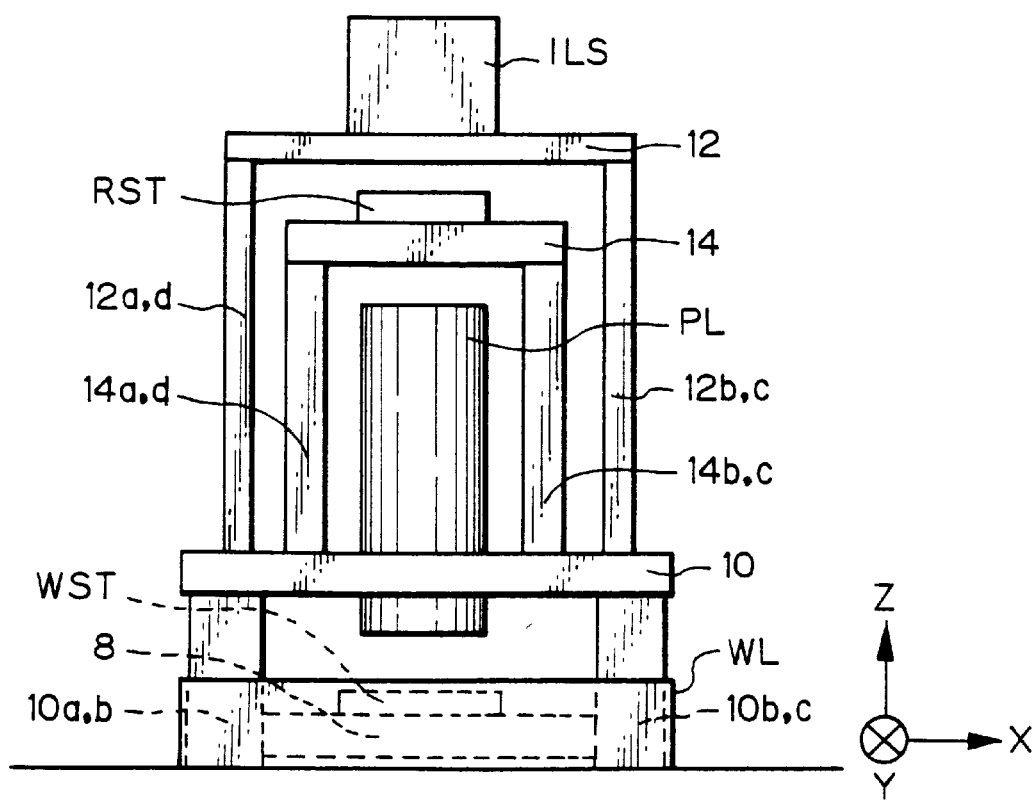
FIG. 6 is a front view of a conventional exposure apparatus.

As shown in FIGS. 5 and 6, in the conventional projection exposure apparatus, support legs (hereinafter, referred to as "apparatus-supporting legs") 10a, 10b, 10c and 10d support an apparatus-supporting member 10 relative to the installation surface. The apparatus-supporting member 10 supports an entire projection exposure apparatus comprising, as main components, an illumination optical system ILS, a projection optical system PL, a reticle stage RST and a wafer stage WST, which are described later. A frame portion (hereinafter, referred to simply as "frame") of the apparatus-supporting member 10 has a rectangular form as viewed from its top. The apparatus-supporting legs 10a, 10b, 10c and 10d are connected to four corner portions of the frame of the rectangular form.

In each of FIGS. 5 and 6, a coordinate system xyz is defined by an x-axis which is parallel to long sides of the rectangular form of the frame of the apparatus-supporting member 10, a y-axis which is horizontal and perpendicular to the x-axis and a z-axis which is vertical relative to an x-y plane defined by the x-axis and the y-axis. In this example, the front of the projection exposure apparatus is a visible side when the projection exposure apparatus is viewed in a plus direction of the y-axis. The passage for the conveying robot is provided along the x-axis. Therefore, in a rectangle determined by the apparatus-supporting legs 10a, 10b, 10c and 10d, two short sides determined by the apparatus-supporting legs 10a and 10d and the apparatus-supporting legs 10b and 10c, respectively, are parallel to the y-axis, and two long sides determined by the apparatus-supporting legs 10a and 10b and the apparatus-supporting legs 10c and 10d, respectively, are parallel to the x-axis.

Four support legs for the illumination optical system (hereinafter, referred to simply as "ILS-supporting legs") 12a, 12b, 12c and 12d are fixed at their respective ends on the apparatus-supporting member 10. As shown in FIG. 5, the respective fixed ends of the ILS-supporting legs 12a, 12b, 12c and 12d on the apparatus-supporting member 10 constitute four corners of a rectangle. Each of the ILS-supporting legs 12a, 12b, 12c and 12d extends along the z-axis and supports an illumination optical system-supporting member (hereinafter, referred to simply as "ILS-supporting member") 12. A frame of the ILS-supporting member 12 has a rectangular form as viewed from its top and the ILS-supporting legs 12a, 12b, 12c and 12d are connected to four corners of the frame of the rectangular form. The ILS-supporting member 12 supports the illumination optical system ILS. In the rectangle determined by the ILS-supporting legs 12a, 12b, 12c and 12d, two short sides determined by the ILS-supporting legs 12a and 12d and the ILS-supporting legs 12b and 12c, respectively, are parallel to the y-axis, and two long sides determined by the ILS-supporting legs 12a and 12b and the ILS-supporting legs 12c and 12d, respectively, are parallel to the x-axis. When the projection exposure apparatus is viewed as a whole, the illumination optical system ILS is disposed at the highest position relative to the installation surface. An illumination light source and an optical system for obtaining desired illumination light (not shown in the drawings) which extend along the y-axis are provided in the illumination optical system ILS.

Four support legs for the reticle stage (hereinafter, referred to simply as "RST-supporting legs") 14a, 14b, 14c and 14d are fixed at their respective ends on the apparatus-supporting member 10 inside the rectangle determined by the ILS-supporting legs 12a, 12b, 12c and 12d. As shown in FIG. 5, the respective fixed ends of the RST-supporting legs 14a, 14b, 14c and 14d on the apparatus-supporting member 10 constitute four corners of a rectangle. Each of the RST-supporting legs 14a, 14b, 14c and 14d extends along the z-axis and supports a reticle stage-supporting member (hereinafter, referred to simply as "RST-supporting member") 14.

A frame of the RST-supporting member 14 has a rectangular form as viewed from its top and the RST-supporting legs 14a, 14b, 14c and 14d are connected to four corners of the rectangular frame. In the rectangle determined by the RST-supporting legs 14a, 14b, 14c and 14d, two short sides determined by the RST-supporting legs 14a and 14d and the RST-supporting legs 14b and 14c, respectively, are parallel to the y-axis, and two long sides determined by the RST-supporting legs 14a and 14b and the RST-supporting legs 14c and 14d, respectively, are parallel to the x-axis. The RST-supporting member 14 supports the reticle stage RST. The reticle stage RST is adapted to move in the x-y plane while having a reticle (not shown in the drawings) provided thereon. During exposure by a so-called step and scan type method, the reticle stage RST is moved along the y-axis. The reticle has formed thereon a predetermined circuit pattern.

The projection optical system PL is provided below the RST-supporting member 14. The projection optical system PL has an optical axis along the z-axis and is supported on the apparatus-supporting member 10. The circuit pattern formed on the reticle provided on the reticle stage RST on the RST-supporting member 14 is illuminated with illumination light from the illumination optical system ILS. The illumination light passes through the reticle and is collected by the projection optical system PL. An image of the circuit pattern on the reticle is formed on an image plane of the projection optical system PL.

The wafer stage WST is supported on a wafer stage-supporting member (hereinafter, referred to simply as "WST-supporting member") 8. The wafer stage WST is adapted to move in the x-y plane while having a wafer in a state such that a surface of the wafer coincides with the above-mentioned image plane of the projection optical system PL. The WST-supporting member 8 is provided below the apparatus-supporting member 10 and supported by the apparatus-supporting legs 10a, 10b, 10c and 10d. During exposure by the step and scan type method, the wafer stage WST is moved along the y-axis synchronously with movement of the reticle stage RST.

A wafer loader WL is disposed adjacent to the front of the projection exposure apparatus. The wafer loader WL takes out a plurality of wafers successively from a wafer library and conveys each wafer to a wafer holder (not shown in the drawings) on the wafer stage WST. The projection exposure apparatus, together with the wafer loader WL, is accommodated in a rectangular parallelepiped chamber 20 which is thermostatic.

As has been described above, in the conventional exposure apparatus, each of the apparatus-supporting member 10, the RST-supporting member 14, the ILS-supporting member 12 and the WST-supporting member 8 is supported at four points by four support legs, to thereby support the main components of the exposure apparatus. In this exposure apparatus, the projection optical system PL is disposed at a position as close to the center (center of gravity) of the exposure apparatus as possible and, in order to move the reticle and the wafer in the x-y plane, especially along the y-axis synchronously, a drive shaft for each of the reticle stage RST and the wafer stage WST is determined as being parallel to a lateral direction or a longitudinal direction of the exposure apparatus, i.e., a direction of the x-axis or a direction of the y-axis in the coordinate system xyz in FIGS. 5 and 6. Further, auxiliary machines for the illumination optical system ILS and various devices are disposed, such that their long sides are parallel to or perpendicular to the longitudinal direction of the exposure apparatus, that is, a direction of the y-axis. By the above-mentioned arrangement, the dynamic stability of the exposure apparatus is improved, so that the exposure apparatus is capable of withstanding tilting and vibration thereof due to movement of the reticle stage RST and wafer stage WST during exposure and hence, exposure is effected with high precision.

However, when each of the main components in the exposure apparatus, such as the illumination optical system ILS, the projection optical system PL, the reticle stage RST and the wafer stage WST, is supported at four points as mentioned above, a problem occurs, such that it is difficult to stably support these components when the installation surface is not a satisfactorily flat surface, because it is difficult to determine a single plane by four support points. Therefore, in order to avoid a lowering of dynamic and static stability of the exposure apparatus due to poor flatness of the installation surface, it is necessary to carry out cumbersome operations to adjust the length of each support leg to an optimum length when the exposure apparatus is installed, to thereby adjust the exposure apparatus to a datum plane.

Further, when the above-mentioned conventional exposure apparatus is employed, a number of exposure apparatuses are installed in a single clean room, so that it is desired that a floor space for installing the exposure apparatus per unit be small, from the viewpoint of costs. However, a chamber in which the conventional exposure apparatuses and the wafer loaders are accommodated must have an area which is slightly larger than the total area of the exposure apparatuses and the wafer loaders, in consideration of a working space for maintenance by an operator. Thus, it is difficult to reduce the floor space for installing the exposure apparatus.

Figure 1:
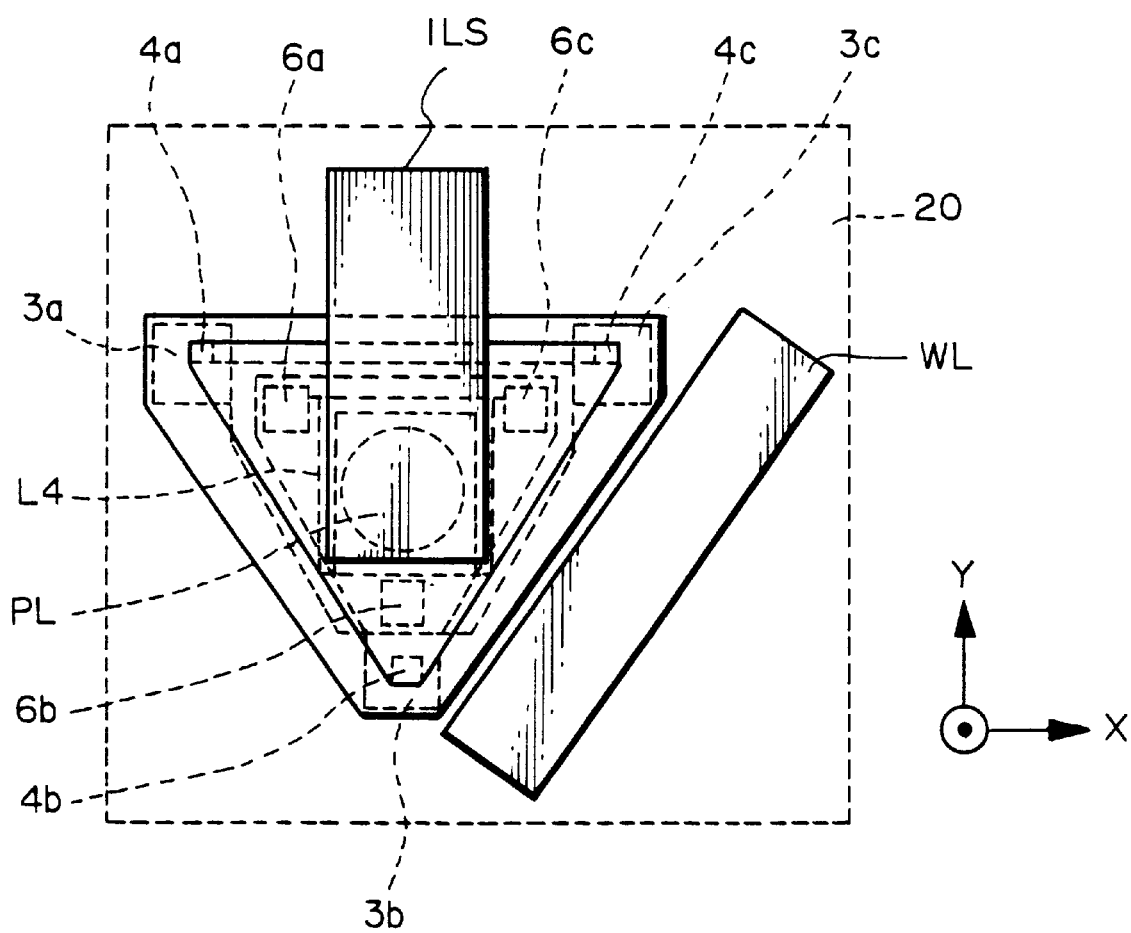
FIG. 1 is a top view of an exposure apparatus according to a first embodiment of the present invention.
Figure 2:
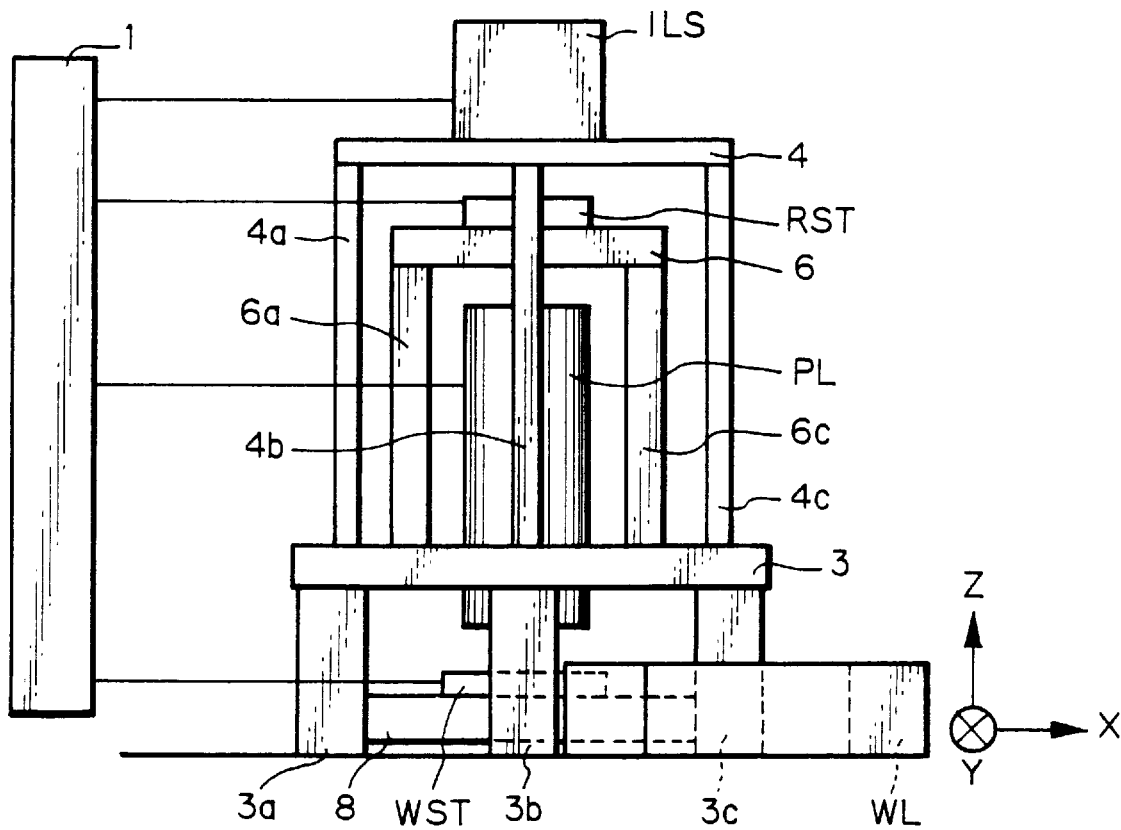
FIG. 2 is a front view of an exposure apparatus according to the first embodiment of the present invention.

Next, an exposure apparatus according to a first embodiment of the present invention is described, with reference to FIGS. 1 and 2. FIG. 1 shows the exposure apparatus in this embodiment, viewed from above toward an installation surface therefor. FIG. 2 shows the exposure apparatus in this embodiment, viewed from a front thereof. In the first embodiment of the present invention, the "front of the exposure apparatus" means a side of the exposure apparatus facing a passage for allowing a conveying robot or the like to pass therethrough to a wafer loader adjacent to the exposure apparatus in a clean room and supply a plurality of wafers to the wafer loader. The exposure apparatus in this embodiment is a scanning projection exposure apparatus of a step and scan type in which a part of a pattern on a reticle is projected through a projection optical system onto a wafer while moving the reticle and the wafer synchronously, to thereby transfer the pattern on the reticle to the wafer.

As shown in FIGS. 1 and 2, in the projection exposure apparatus according to the first embodiment of the present invention, an apparatus-supporting member 3 is supported relative to the installation surface at three points by apparatus-supporting legs 3a, 3b and 3c. The apparatus-supporting member 3 supports an entire projection exposure apparatus comprising, as main components, an illumination optical system ILS, a projection optical system PL, a reticle stage RST and a wafer stage WST, which are described later. A control device 1 is employed to control the entire projection exposure apparatus, especially, to move the reticle stage RST and the wafer stage WST synchronously in opposite directions (the plus and minus directions of the y-axis). A frame of the apparatus-supporting member 3 has a substantially isosceles triangular form as viewed from its top, and the apparatus-supporting legs 3a, 3b and 3c are connected to three corner portions of the frame of the substantially isosceles triangular form.

Each of the apparatus-supporting legs 3a, 3b and 3c has a horizontal cross-section in a substantially square form, and the corner portion of the frame of the apparatus-supporting member 3 is a portion which is cut along one side of the substantially square form of the horizontal cross-section of each of the apparatus-supporting legs 3a, 3b and 3c.

Therefore, accurately, the frame of the apparatus-supporting member 3 has a hexagonal form as viewed from its top, as shown in FIG. 1. However, in order to make the present invention to be easily understood by simple explanation, in the following description, it is assumed that the frame of the apparatus-supporting member 3 has an isosceles triangular form as viewed from its top. As shown in FIG. 1, a base of the isosceles triangular form of the frame of the apparatus-supporting member 3 is defined by the apparatus-supporting legs 3a and 3c. The vertex opposite the base is constituted by the apparatus-supporting leg 3b. The side determined by the apparatus-supporting legs 3a and 3b and the side determined by the apparatus-supporting legs 3b and 3c are equal in length.

In each of FIG. 1 and FIG. 2, a coordinate system xyz is defined by an x-axis which is parallel to one side of the isosceles triangular form of the frame of the apparatus-supporting member 3, a y-axis which is horizontal and perpendicular to the x-axis and a z-axis which is vertical relative to an x-y plane defined by the x-axis and the y-axis. In the first embodiment of the present invention, the front of the exposure apparatus is a visible side when the exposure apparatus is viewed from the apparatus-supporting leg 3b in the plus direction of the y-axis. The passage for the conveying robot is provided along the x-axis and on the side in the minus direction of the y-axis relative to the apparatus-supporting leg 3b. Thus, in the exposure apparatus in the first embodiment, the base of the isosceles triangular form, which is defined by the apparatus-supporting legs 3a and 3c, is parallel to the x-axis.

ILS-supporting legs 4a, 4b and 4c are fixed at their respective ends on the apparatus-supporting member 3 in line with or spaced inwardly from the axes of the apparatus-supporting legs 3a, 3b and 3c. The respective fixed ends of the ILS-supporting legs 4a, 4b and 4c on the apparatus-supporting member 3 constitute three vertexes of an isosceles triangle. Each of the ILS-supporting legs 4a, 4b and 4c extends along the z-axis and supports an ILS-supporting member 4. A frame of the ILS-supporting member 4 has a substantially isosceles triangular form as viewed from its top, and the ILS-supporting legs 4a, 4b and 4c are connected to three corner portions of the substantially isosceles triangular form of the frame. Accurately, the frame of the ILS-supporting member 4 has a hexagonal form for the same reasons as mentioned above in connection with the frame of the apparatus-supporting member 3. However, for easy understanding of the present invention, it is assumed that the ILS-supporting member 4 has an isosceles triangular form as viewed from its top. The ILS-supporting member 4 supports the illumination optical system ILS.

In the isosceles triangle determined by the ILS-supporting legs 4a, 4b and 4c, a base defined by the ILS-supporting legs 4a and 4c is parallel to the x-axis, and the ILS-supporting leg 4b constituting one vertex opposite the base is located at the front of the exposure apparatus. When the exposure apparatus is viewed as a whole, the illumination optical system ILS is disposed at the highest position relative to the installation surface. As viewed in a direction of the z-axis (i.e., a vertical direction relative to the installation surface), the illumination optical system ILS is disposed at a position such that it is substantially symmetrical with respect to a straight line drawn from the ILS-supporting leg 4b which constitutes one vertex of the isosceles triangle (determined by the ILS-supporting legs 4a, 4b and 4c) toward the middle point between the ILS-supporting legs 4a and 4c defining the base of the isosceles triangle as a side opposite the one vertex constituted by the ILS-supporting leg 4b.

Three RST-supporting legs 6a, 6b and 6c are fixed at their respective ends on the apparatus-supporting member 3 inside the isosceles triangle determined by the ILS-supporting legs 4a, 4b and 4c. As shown in FIG. 1, the respective fixed ends of the RST-supporting legs 6a, 6b and 6c on the apparatus-supporting member 3 constitute three vertexes of an isosceles triangle. Each of the RST-supporting legs 6a, 6b and 6c extends along the z-axis and supports an RST-supporting member 6. A frame of the RST-supporting member 6 has an isosceles triangular form as viewed from its top and the RST-supporting legs 6a, 6b and 6c are connected to three vertexes of the isosceles triangular form of the frame. Accurately, the frame of the RST-supporting member 6 has a hexagonal form for the same reasons as mentioned above in connection with the frame of the apparatus-supporting member 3. However, for easy understanding of the present invention, it is assumed that the frame of the RST-supporting member 6 has an isosceles triangular form as viewed from its top. In the isosceles triangle determined by the RST-supporting legs 6a, 6b and 6c, a base defined by RST-supporting legs 6a and 6c is parallel to the x-axis. The RST-supporting member 6 supports the reticle stage RST. The reticle stage RST is adapted to move in the x-y plane while having a reticle (not shown in the drawings) provided thereon. During exposure by the step and scan type method, the reticle stage RST is moved in the plus direction of the y-axis.

That is, as viewed in a direction of the z-axis (i.e., a vertical direction relative to the installation surface), the scanning direction of the reticle stage RST is substantially parallel to a straight line drawn from one vertex of the isosceles triangle determined by the three support legs supporting the RST-supporting member toward the middle point in a side opposite the vertex.

The projection optical system PL is provided below the RST-supporting member 6. The projection optical system PL has an optical axis along the z-axis and is supported on the apparatus-supporting member 3. The circuit pattern formed on the reticle provided on the reticle stage RST on the RST-supporting member 6 is illuminated with illumination light from the illumination optical system ILS. The illumination light passes through the reticle and is collected by the projection optical system PL. An image of the circuit pattern on the reticle is formed on an imaging plane of the projection optical system PL.

The wafer stage WST is supported on a WST-supporting member 8. The wafer stage WST is adapted to move in the x-y plane while having a wafer in a state such that a surface of the wafer coincides with the above-mentioned imaging plane of the projection optical system PL. The WST-supporting member 8 is provided below the apparatus-supporting member 3 and supported by the apparatus-supporting legs 3a, 3b and 3c. During exposure by the step and scan type method, the wafer stage WST is moved in the minus direction of the y-axis synchronously with movement of the reticle stage RST. That is, as viewed in a direction of the z-axis (i.e., a vertical direction relative to the installation surface), the scanning direction of the wafer stage WST is substantially parallel to a straight line drawn from one vertex of the isosceles of the triangle determined by the three support legs supporting the WST-supporting member toward the middle point in a side opposite the vertex.

A wafer loader WL is disposed adjacent to one side determined by the apparatus-supporting legs 3b and 3c on the right side of the exposure apparatus in FIGS. 1 and 2. That is, the wafer loader WL for loading and unloading a wafer with respect to the wafer stage WST is disposed along one side of the isosceles triangle determined by three support legs, as viewed in a vertical direction relative to the installation surface. The projection exposure apparatus, together with the wafer loader WL, is accommodated in a chamber 20 which is thermostatic.

As has been described above, the exposure apparatus in the first embodiment of the present invention is supported as a whole at three points. Therefore, differing from the conventional exposure apparatus which is supported as a whole at four points, wherein cumbersome operations for adjustment of the length of each support leg must be conducted when the exposure apparatus is installed, the exposure apparatus in this embodiment of the present invention can be easily adjusted to a datum plane.

In the exposure apparatus in the first embodiment of the present invention, the wafer stage WST and the reticle stage RST are moved along the x-axis and the y-axis shown in FIGS. 1 and 2. The illumination optical system ILS, which has a large weight and is provided at the highest position in the exposure apparatus, is symmetrical with respect to the y-axis along which the wafer stage WST and the reticle stage RST are moved synchronously during exposure, and is stably supported by two support legs. More particularly, as shown in FIG. 1, the illumination optical system ILS is an elongated structure which extends from a central portion of the isosceles triangle determined by three support legs (supporting the ILS-supporting member at three support points) across one side of the isosceles triangle. Although the center of gravity of the illumination optical system ILS is shifted toward one side across which the illumination optical system ILS extends, the weight of a portion of the illumination optical system ILS around that side of the isosceles triangle is satisfactorily stably supported by two support legs. Further, the exposure apparatus as a whole is symmetrical with respect to the y-axis along which the wafer stage WST and the reticle stage RST are moved synchronously during exposure, so that the exposure apparatus has an excellent ability to withstand vibration thereof due to movement of the wafer stage WST and the reticle stage RST during exposure. The wafer loader WL is not symmetrical with respect to the y-axis at its position. However, because the wafer loader WL can be provided separately from the exposure apparatus, it is possible to prevent the wafer loader WL from adversely affecting the stability of the exposure apparatus.

By the arrangement in the first embodiment of the present invention, a distance between the wafer loader WL and the wafer stage WST is small, so that it has become possible to effectively utilize a space within the exposure apparatus and hence, an improvement in performance of the exposure apparatus and reduction in the floor space for installing the exposure apparatus can be achieved.

Figure 3:
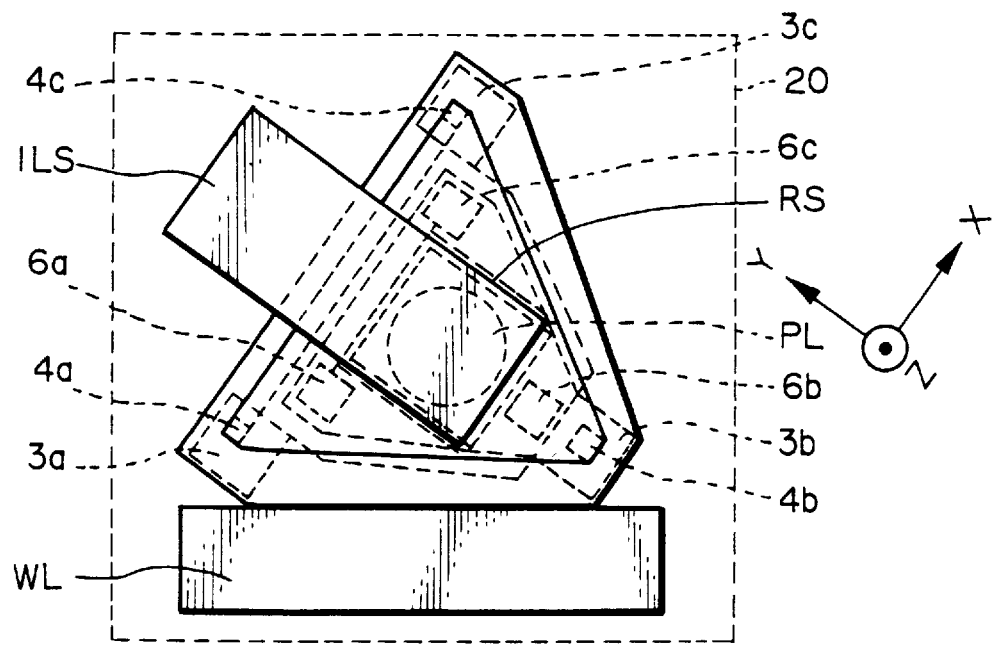
FIG. 3 is a top view of an exposure apparatus according to a second embodiment of the present invention.
Figure 4:
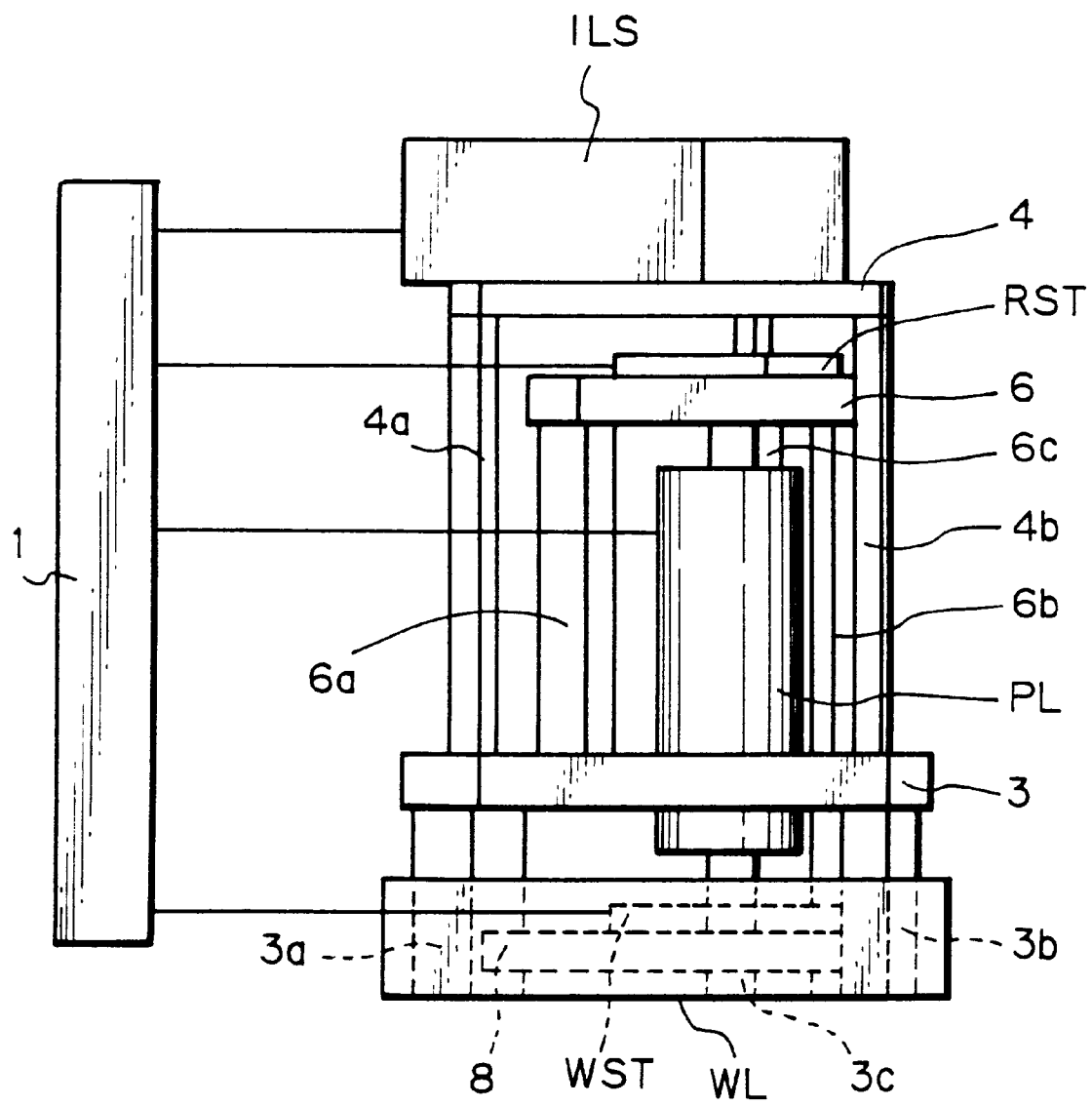
FIG. 4 is a front view of an exposure apparatus according to the second embodiment of the present invention.

Hereinbelow, an exposure apparatus according to a second embodiment of the present invention is described, with reference to FIGS. 3 and 4. FIG. 3 shows the exposure apparatus in this embodiment, viewed from above toward an installation surface therefor. FIG. 4 shows the exposure apparatus in this embodiment, viewed from a front thereof.

In the second embodiment of the present invention, the "front of the exposure apparatus" means a side of the exposure apparatus facing a passage for allowing a conveying robot or the like to pass therethrough to a wafer loader adjacent to the exposure apparatus in a clean room and supply a plurality of wafers to the wafer loader. The exposure apparatus in this embodiment is of the same type as that of the exposure apparatus in the first embodiment, that is, a scanning projection exposure apparatus of a step and scan type. In the second embodiment of the present invention, the members and portions of the exposure apparatus have the same function and effects as those in the first embodiment of the present invention. Therefore, in FIGS. 3 and 4, the members and portions of the exposure apparatus are denoted by the same reference numerals as used in the first embodiment of the present invention and descriptions of those members and portions are omitted to avoid overlapping.

In the second embodiment of the present invention, as shown in each of FIG. 3 and FIG. 4, the same coordinate system xyz as used in the first embodiment of the present invention is employed, that is, the coordinate system defined by an x-axis which is parallel to one side of the isosceles triangular form of the frame of the apparatus-supporting member 3, a y-axis which is horizontal and perpendicular to the x-axis and a z-axis which is vertical relative to an x-y plane defined by the x-axis and the y-axis. However, in the second embodiment of the present invention, the coordinate system xyz is rotated about the z-axis at a predetermined angle. Therefore, in the second embodiment, the front of the exposure apparatus corresponds to a side determined by the apparatus-supporting legs 3a and 3b, and the passage for the conveying robot is provided in parallel to the side determined by the apparatus-supporting legs 3a and 3b.

As viewed in a direction of the z-axis (i.e., a vertical direction relative to the installation surface) in the above-mentioned coordinate system xyz, the illumination optical system ILS is disposed at a position such that it is substantially symmetrical with respect to a straight line drawn from the ILS-supporting leg 4b which constitutes one vertex of the isosceles triangle (determined by the ILS-supporting legs 4a, 4b and 4c) toward the middle point between the ILS-supporting legs 4a and 4c determining the base of the isosceles triangle, i.e., a side opposite the vertex constituted by the ILS-supporting leg 4b.

The reticle stage RST is adapted to move in the x-y plane while having a reticle (not shown in the drawings) provided thereon. During exposure by the step and scan type method, the reticle stage RST is moved in a direction of the y-axis. That is, as viewed in a direction of the z-axis (i.e., a vertical direction relative to the installation surface), the scanning direction of the reticle stage RST is substantially parallel to a straight line drawn from one vertex of the isosceles triangle determined by the three support legs supporting the RST-supporting member toward the middle point in a side opposite the vertex.

With respect to the wafer stage WST, during exposure by the step and scan type method, the wafer stage WST is moved in a direction of the y-axis synchronously with movement of the reticle stage RST. That is, as viewed in a direction of the z-axis (i.e., a vertical direction relative to the installation surface), the scanning direction of the wafer stage WST is substantially parallel to a straight line drawn from one vertex of the isosceles triangle determined by the three support legs supporting the WST-supporting member toward the middle point in a side opposite the vertex.

A wafer loader WL is disposed adjacent to the side determined by the apparatus-supporting legs 3a and 3b at the front of the exposure apparatus, as shown in FIG. 3. That is, the wafer loader WL for loading and unloading a wafer with respect to the wafer stage WST is disposed along one side of the isosceles triangle determined by three support legs, as viewed in a vertical direction relative to the installation surface. The projection exposure apparatus, together with the wafer loader WL, is accommodated in a chamber 20 which is thermostatic. One wall surface of the chamber 20 is disposed in parallel to one side of the isosceles triangle determined by the apparatus-supporting legs 3a, 3b and 3c, along which the wafer loader WL is disposed.

In the exposure apparatus in the second embodiment of the present invention, the illumination optical system ILS, which has a large weight and is provided at the highest position in the exposure apparatus, is symmetrical with respect to the y-axis along which the wafer stage WST and the reticle stage RST are moved synchronously during exposure, and is stably supported by two support legs. Further, the exposure apparatus is symmetrical as a whole with respect to the y-axis along which the wafer stage WST and the reticle stage RST are moved synchronously during exposure, so that the exposure apparatus has an excellent ability to withstand vibration thereof due to movement of the wafer stage WST and the reticle stage RST during exposure. The wafer loader WL is not symmetrical with respect to the y-axis at its position. However, because the wafer loader WL can be provided separately from the exposure apparatus, it is possible to prevent the wafer loader WL from adversely affecting the stability of the exposure apparatus.

Further, as shown in FIGS. 3 and 4, in the exposure apparatus in the second embodiment of the present invention, the exposure apparatus is rotated about the z-axis at a predetermined angle relative to the exposure apparatus in the first embodiment of the present invention. In the first embodiment of the present invention, problems are likely to occur, such that the position of an interface between the wafer loader and a wafer coater/a wafer developer in a production line is limited to one side of the exposure apparatus (e.g., the right side in FIG. 1), leading to a lack of flexibility in arrangement of the production line, and that when a plurality of exposure apparatuses are employed, accessibility of the exposure apparatuses is poor. The exposure apparatus in the second embodiment of the present invention is free from these problems.

By the arrangement in the second embodiment of the present invention, as in the case of the first embodiment of the present invention, a distance between the wafer loader WL and the wafer stage WST is small, so that it has become possible to effectively utilize a space within the exposure apparatus and hence, an improvement in performance of the exposure apparatus and reduction in the floor space for installing the exposure apparatus can be achieved. Further, in the second embodiment of the present invention, the illumination optical system ILS, which protrudes backward in the conventional exposure apparatus, is disposed obliquely relative to the front of the exposure apparatus, so that the length of the entire exposure apparatus can be reduced. Further, in the exposure apparatus in the second embodiment of the present invention, the wafer loader WL can be disposed adjacent to the front of the exposure apparatus as in the conventional exposure apparatus. Therefore, flexibility in installing the exposure apparatus can be ensured. In addition, symmetry of the exposure apparatus can be maintained, so that the exposure apparatus has an excellent dynamic stability.

The present invention is not limited to the above-mentioned embodiments. Various modifications are possible, as long as they fall within the scope of the present invention defined in the appended claims. In the above-mentioned embodiments, the present invention is applied to a scanning project exposure apparatus of a so-called step and scan type. However, the present invention may be applied to a projection exposure apparatus of a so-called step and repeat type in which a pattern on a reticle is projected through a projection optical system as a reduced pattern image and the reduced pattern image is formed on each shot area on a wafer.

When the present invention is applied to the above-mentioned projection exposure apparatus of a step and repeat type, the exposure apparatus of the present invention is an exposure apparatus which comprises an illumination optical system ILS for illuminating a reticle, a reticle stage RST for holding thereon the reticle, a projection optical system PL for projecting therethrough a pattern on the reticle and a wafer stage WST for holding thereon a wafer, which is adapted to move along an x-axis and a y-axis in a two-dimensional plane so as to position the wafer at an imaging position of the pattern, and is supported as a whole relative to an installation surface at three points by three support legs, wherein as viewed in a vertical direction relative to the installation surface, either of the x-axis and the y-axis with respect to the wafer stage WST is parallel to a straight line drawn from one vertex of a triangle determined by the three support legs toward the middle point in a side opposite the vertex.

In the above-mentioned embodiments, the three support legs determine an isosceles triangle. However, in the present invention, the support legs may determine a triangle other than an isosceles triangle.

What is claimed is:

1. An exposure apparatus for transferring a pattern of a mask to a substrate, comprising:
    a scanning mechanism that moves said mask and said substrate synchronously in a scanning direction;
    a support mechanism having three support legs and supporting at least part of said exposure apparatus, said three support legs being adapted to support said support mechanism at three points relative to an installation surface for said exposure apparatus; and
    an illumination optical system illuminate said mask having the pattern, said illumination optical system being disposed along said scanning direction,
    wherein as viewed in a vertical direction relative to said installation surface, said three support legs constitute three vertexes of a triangle and said scanning direction is substantially coincident with a direction of a straight line drawn from one vertex of said triangle toward the middle point in one side of said triangle, said one side of the triangle being opposite said one vertex.

2. An exposure apparatus according to claim 1, wherein said illumination optical system extends from a central portion of said triangle across said one side of the triangle.

3. An exposure apparatus according to claim 1, wherein said supporting mechanism comprises:
    an apparatus-supporting member having a frame;
    first three support legs which support said frame of the apparatus-supporting member at three points;
    an illumination optical system-supporting member having a frame and adapted to support said illumination optical system; and
    second three support legs fixed to said frame of the apparatus-supporting member to support said frame of the illumination optical system-supporting member at three points,
    wherein said first support legs determine a first triangle and said second support legs determine a second triangle, and the sides of said first triangle and the corresponding sides of said second triangle are parallel to each other.

4. An exposure apparatus according to claim 3, further comprising:
    a mask stage adapted to support said mask; and
    a substrate stage adapted to support said substrate,
    wherein said support mechanism further comprises:
        a mask stage-supporting member having a frame and adapted to support said mask stage; and
        third three support legs which support said frame of the mask-supporting member at three points on said frame of the apparatus-supporting member and wherein said third support legs determine a third triangle and the sides of said first triangle and the corresponding sides of said third triangle are parallel to each other.

5. An exposure apparatus according to claim 1, wherein said support mechanism further supports a substrate stage and as viewed in the vertical direction relative to said installation surface, a substrate-conveying apparatus for loading said substrate onto said substrate stage and unloading said substrate from said substrate stage is disposed along one side of said triangle determined by the three support legs.

6. An exposure apparatus according to claim 5, wherein a chamber is provided on said installation surface to accommodate said exposure apparatus and one wall surface of said chamber is substantially parallel to said one side of the triangle along which said substrate-conveying apparatus is disposed.

7. An exposure apparatus according to claim 1, wherein said support mechanism supports said illumination optical system.

8. An exposure apparatus according to claim 1, further comprising:
    a projection optical system which is disposed between said mask and said substrate to project said pattern onto said substrate.

9. An exposure apparatus according to claim 8, wherein said support mechanism supports said projection optical system.

10. An exposure apparatus according to claim 1, further comprising:
    a mask stage which holds said mask; and
    a substrate stage which holds said substrate.

11. An exposure apparatus according to claim 10, wherein said support mechanism supports at least one of said mask stage and said substrate stage.

12. A substrate on which a pattern has been formed utilizing the exposure apparatus of claim 1.

13. An exposure apparatus comprising:
    a mask stage adapted to move while holding a mask thereon, said masking having a pattern;
    a substrate stage positioned to move while holding a substrate thereon, said substrate being positioned to have formed thereon an image of said pattern;
    a scanning device connected to said mask stage and said substrate stage to move said mask stage and said substrate stage synchronously in predetermined scanning directions;
    a support mechanism having three support legs, said three support legs being adapted to support at least part of said exposure apparatus at three points relative to an installation surface for said exposure apparatus; and
    a first substrate-conveying apparatus that conveys said substrate onto said substrate stage,
    wherein as viewed in a vertical direction relative to said installation surface, said three support legs constitute three vertexes of a triangle and said first substrate-conveying apparatus is disposed along one side of said triangle determined by said three support legs.

14. An exposure apparatus according to claim 13, wherein said support mechanism further supports an illumination optical system and said illumination optical system is disposed at a position such that as viewed in a vertical direction relative to said installation surface, said illumination optical system is substantially symmetrical with respect to said straight line drawn from one vertex of said triangle determined by the three support legs toward the middle point in the opposite side of said triangle.

15. An exposure apparatus according to claim 14, wherein said illumination optical system extends from a central portion of said triangle across said one side of the triangle.

16. An exposure apparatus according to claim 13, wherein a chamber is provided on said installation surface to accommodate said exposure apparatus and one wall surface of said chamber is substantially parallel to said one side of the triangle along which said first substrate-conveying apparatus is disposed.

17. An exposure apparatus according to claim 13, wherein said scanning direction is not parallel to a disposed direction of said first substrate-conveying apparatus.

18. An exposure apparatus according to claim 13, further comprising:
a second substrate-conveying apparatus that conveys said substrate from said substrate stage.

19. An exposure apparatus according to claim 13, further comprising:
a projection optical system which is disposed between said mask and said substrate to project said pattern onto said substrate.

20. An exposure apparatus according to claim 19, wherein said support mechanism supports said projection optical system.

21. An exposure apparatus according to claim 13, wherein said support mechanism supports at least one of said mask stage and said substrate stage.

22. A substrate on which a pattern has been formed utilizing the exposure apparatus of claim 7.

23. An exposure apparatus for transferring a pattern of a mask to a substrate, comprising:
a substrate stage adapted to move, while holding said substrate thereon, in a two-dimensional plane in one predetermined direction and a direction perpendicular to said one predetermined direction;
a support mechanism having three support legs, said three support legs being adapted to support at least part of said exposure apparatus at three points relative to an installation surface for said exposure apparatus;
a chamber that accommodates said exposure apparatus; and
wherein as viewed in a vertical direction relative to said installation surface, said three support legs constitute three vertexes of a triangle and one wall surface of said chamber is substantially parallel to one side of the triangle.

24. An exposure apparatus according to claim 23, further comprising a mask stage adapted to move, while holding said mask thereon, in a two-dimensional plane in one direction parallel to said one predetermined direction of movement of the substrate stage and a direction perpendicular to said one direction,
wherein said support mechanism comprises:
an apparatus-supporting member having a frame;
first three support legs which support said frame of the apparatus-supporting member at three points;
a substrate stage-supporting member fixed to said first support legs to support said substrate stage;
a mask stage-supporting member having a frame and adapted to support said mask stage; and
third three support legs which connect said frame of the apparatus-supporting member and said frame of the mask stage-supporting member, and
wherein said first support legs determine a first triangle and said third support legs determine a third triangle, and the sides of said first triangle and the corresponding sides of said third triangle are parallel to each other.

25. An exposure apparatus according to claim 23, wherein as viewed in said vertical direction relative to said installation surface, a substrate-conveying apparatus for loading said substrate onto said substrate stage and unloading said substrate from said substrate stage is disposed along one side of said triangle determined by the three support legs.

26. An exposure apparatus according to claim 23, wherein as viewed in said vertical direction relative to said installation surface, a substrate-conveying apparatus for conveying said substrate onto said substrate stage is disposed along one predetermined wall surface of said chamber.

27. An exposure apparatus according to claim 26, wherein said one predetermined wall surface of said chamber is one wall surface of said chamber.

28. An exposure apparatus according to claim 23, further comprising:
a projection optical system which is disposed between said mask and said substrate to project said pattern onto said substrate.

29. An exposure apparatus according to claim 28, wherein said support mechanism supports said projection optical system.

30. An exposure apparatus according to claim 23, further comprising:
a mask stage which holds said mask.

31. An exposure apparatus according to claim 30, wherein said support mechanism supports at least one of said mask stage and said substrate stage.

32. A substrate one which a pattern has been formed utilizing the exposure apparatus of claim 23.

33. An exposure method used in an exposure apparatus which forms a pattern of a mask onto a substrate, comprising the steps of:
supporting a support mechanism at three points by three support legs, said support mechanism being adapted to support at least part of said exposure apparatus and said three support legs being supported on an installation surface;
moving said mask and said substrate in a scanning direction; and
illuminating said mask by an illumination optical system, said illumination optical system being disposed along said scanning direction, wherein
said scanning direction is substantially coincident with a direction of a straight line drawn from one vertex of a triangle determined by said three support legs toward the middle point in one side of the triangle, said one side of the triangle being opposite said one vertex.

34. A method according to claim 33, wherein said illumination optical system is disposed at a position such that the illumination optical system extends from a central portion of said triangle across said one side of the triangle.

35. An exposure method according to claim 33, wherein said support mechanism supports said illumination optical system.

36. An exposure method according to claim 33, further comprising the step of:

projecting said pattern onto said substrate by a projection optical system.

37. An exposure method according to claim 36, wherein said support mechanism supports said projection optical system.

38. An exposure method according to claim 33, wherein said support mechanism supports at least one of said mask and said substrate.

39. A method for making an exposure apparatus that forms a pattern of a mask onto a substrate, comprising the steps of:

providing a mask stage adapted to move while holding said mask thereon;

providing a substrate stage adapted to move while holding said substrate thereon, said substrate being positioned to have formed thereon an image of said pattern;

providing a drive which drives said mask stage and said substrate stage synchronously in a predetermined scanning direction;

providing a first substrate-conveying apparatus that conveys said substrate onto said substrate stage; and providing a support mechanism having three support legs to support at least part of said exposure apparatus, said three support legs being supported on an installation surface for said exposure apparatus wherein as viewed in a vertical direction relative to said installation surface, said first substrate-conveying apparatus is disposed along one side of a triangle determined by said three support legs.

40. An exposure method according to claim 39, wherein an illumination optical system having a central axis is supported by said support mechanism, said illumination optical system being disposed in a manner such that as viewed in a vertical direction relative to said installation surface, said central axis of the illumination optical system is substantially coincident with said straight line drawn from one vertex of said triangle determined by said three support legs toward the middle point in the opposite side of the triangle, and exposure light for transferring said pattern of the mask to said substrate is emitted from said illumination optical system.

41. A method according to claim 39, wherein said scanning direction is not parallel to a disposed direction of said first substrate-conveying apparatus.

42. A method according to claim 39, further comprising:

providing a second substrate-conveying apparatus that conveys said substrate from said substrate stage.

43. A method according to claim 39, further comprising:

providing a projection optical system between said mask and said substrate to project said pattern onto said substrate.

44. A method according to claim 43, wherein said support mechanism supports said projection optical system.

45. A method according to claim 39, wherein said support mechanism supports at least one of said mask stage and said substrate stage.

46. A method for making an exposure apparatus that forms a pattern onto a substrate, comprising the steps of:

providing a substrate stage to move, while holding said substrate thereon, in a scanning direction;

providing a support mechanism having three support legs, said three support legs being adapted to support at least part of said exposure apparatus relative to an installation surface for said exposure apparatus; and providing a chamber that accommodates said exposure apparatus, wherein, as viewed in a vertical direction relative to said installation surface, said three support legs constitute three vertexes of a triangle and one wall surface of said chamber is substantially parallel to one side of the triangle.

47. A method according to claim 46, wherein as viewed in said vertical direction relative to said installation surface, a substrate-conveying apparatus for conveying said substrate onto said substrate stage is disposed along one predetermined wall surface of said chamber.

48. A method according to claim 47, wherein said one predetermined wall surface of said chamber is said one wall surface of said chamber.

49. A method according to claim 46, wherein said pattern is formed on a mask.

50. A method according to claim 49, further comprising the step of providing a projection optical system between said mask and said substrate to project said pattern onto said substrate.

51. A method according to claim 50, wherein said support mechanism supports said projection optical system.

52. A method according to claim 49, further comprising the step of providing a mask stage which holds said mask.

53. A method according to claim 52, wherein said support mechanism supports at least one of said mask stage and said substrate stage.

* * * * *